United States Patent [19]
Shing

[11] Patent Number: 6,005,438
[45] Date of Patent: Dec. 21, 1999

[54] OUTPUT HIGH VOLTAGE CLAMPED CIRCUIT FOR LOW VOLTAGE DIFFERENTIAL SWING APPLICATIONS IN THE CASE OF OVERLOAD

[75] Inventor: Peter Shing, San Jose, Calif.

[73] Assignee: National Semiconductor Corporation, Santa Clara, Calif.

[21] Appl. No.: 08/988,523

[22] Filed: Dec. 10, 1997

[51] Int. Cl.[6] .................................................. H03F 3/45
[52] U.S. Cl. ........................ 330/253; 330/146; 327/309
[58] Field of Search ................................. 330/146, 253; 327/309, 321, 327, 328, 180

[56] References Cited

U.S. PATENT DOCUMENTS

| | | | |
|---|---|---|---|
| 3,495,223 | 2/1970 | Martin, Jr. ................................. | 330/252 |
| 4,084,070 | 4/1978 | Reed et al. ................................. | 178/69 |
| 4,556,805 | 12/1985 | Shoji ........................................ | 327/359 |
| 4,775,844 | 10/1988 | Snyder ..................................... | 330/298 |
| 4,791,314 | 12/1988 | Kuo et al. ................................. | 307/270 |
| 4,845,386 | 7/1989 | Uneo ........................................ | 307/446 |
| 4,884,165 | 11/1989 | Kong et al. ................................ | 361/98 |
| 4,987,318 | 1/1991 | Burke et al. .............................. | 307/443 |
| 5,083,051 | 1/1992 | Whatley et al. .......................... | 327/571 |
| 5,404,051 | 4/1995 | Kobayashi ................................ | 327/170 |
| 5,424,683 | 6/1995 | Takahashi ................................. | 330/255 |
| 5,444,446 | 8/1995 | Gopinathan et al. .................... | 341/135 |
| 5,530,271 | 6/1996 | Fallica ...................................... | 257/173 |
| 5,576,634 | 11/1996 | Kamiya .................................... | 326/26 |
| 5,604,417 | 2/1997 | Kaminaga et al. ....................... | 320/17 |
| 5,614,848 | 3/1997 | Kaminaga et al. ...................... | 326/110 |
| 5,632,019 | 5/1997 | Masiewicz ............................... | 395/250 |
| 5,721,504 | 2/1998 | Sato ......................................... | 327/328 |
| 5,812,021 | 9/1998 | Ikeda ....................................... | 327/313 |

*Primary Examiner*—Robert Pascal
*Assistant Examiner*—Khanh Van Nguyen
*Attorney, Agent, or Firm*—Limbach & Limbach L.L.P.

[57] ABSTRACT

A low voltage differential swing circuit includes a clamping circuit to prevent the output high voltage from exceeding a reference voltage. The low voltage differential swing circuit also includes a current source coupled to a control node and a current steering circuit coupled between the control node and first and second output nodes. The current source provides a constant drive current, and in response to first and second input signals, the current steering circuit generates first and second drive currents, wherein the first and second drive currents together form at the first and second output nodes a differential output signal. The clamping circuit comprises a operational amplifier and a shunting circuit. The operational amplifier senses the difference between a reference voltage and a voltage level at the control node, which voltage level varies in relation to the voltage level of the differential output signal. When the voltage level at the control node transcends the reference voltage value, the excess drive current, or overload current, is shunted away from the first and second output nodes by the shunting circuit. Thus, the overload current is prevented from reaching the first and second output nodes.

12 Claims, 2 Drawing Sheets

OUTPUT HIGH VOLTAGE CLAMPED CIRCUIT FOR LOW VOLTAGE DIFFERENTIAL SWING APPLICATIONS IN THE CASE OF OVERLOAD

BACKGROUND OF THE INVENTION

1. Technical Field of the Invention

The present invention relates to the field of transistor driver circuits and in particular, to a high voltage clamped circuit for low voltage differential swing applications in the case of overload.

2. Description of the Related Art

The constant need to transfer more information faster, accompanied by increases in data processing capability, necessitated an expansion to data transfer rates considerably higher than what was previously possible. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

One type of data transmission is differential data transmission in which the difference in voltage levels between two signal lines form the transmitted signal. Differential data transmission is commonly used for data transmission rates greater than 100 Mbps over long distances. Noise signals shift the ground level voltage and appear as common mode voltages. Thus, the deleterious effects of noise are substantially reduced.

To standardize such data transmission various standards have been promulgated. For example, one such standard is the recommended standard 422, RS422, which is defined by the Electronics Industry of America, EIA. This standard permits data rates up to 10 million baud over a twisted pair of signal lines. Driver circuits place signals on the lines. These drivers circuits must be capable of transmitting a minimum differential signal in the range of two to three volts on the twisted pair line which typically terminates in 100 ohms of resistance.

One problem with RS422 is that the twisted line pair is often used as a bus to which multiple driver circuits, sources of signal, are attached. In one type of conventional circuits, when multiple drivers are connected to a common bus, only one driver may transmit data at a time. The remaining drivers should be in a high impedance state so as to not load the bus. Since large positive and negative common mode signals may appear at the driver output terminals connected to a bus system, the maintenance of a high impedance over a wide common mode voltage range independent of whether the driver is powered or not, is desirable.

An example of a conventional low voltage differential swing (LVDS) driver circuit 100 is shown in FIG. 1. The difference in voltage between the output signals OUT+, OUT− on the output terminals 103, 105 form the pair of differential signals. A pair of differential signals means two signals whose current waveforms are out of phase with one another. The individual signals of a pair of differential signals are indicated by reference symbols respectively ending with "+" and "−" notation-e.g., S+ and S−. The composite notation "+/−" is employed to indicate both differential signals using a single reference symbol, e.g., S+/−.

The LVDS driver circuit 100 includes a direct current (DC) constant current source I1 coupled to voltage supply VDD, four n-channel metal oxide semiconductor (NMOS) switches M11–M14, and a resistor R1 coupled between the common node COM and voltage supply VSS. The four transistor switches M11–M14 are controlled by input voltage signals VIN1, VIN2 and direct current through load resistor Rt as indicated by arrows A and B. The input voltage signals VIN1, VIN2 are typically rail-to-rail voltage swings.

The gates of NMOS switches M11 and M14 couple together to receive input voltage signal VIN1. Similarly, the gates of NMOS switches M12 and M13 couple together to receive input voltage signal VIN2.

Operation of the LVDS driver circuit 100 is explained as follows. Two of the four NMOS switches M11–M14 turn on at a time to steer current from current source I1 to generate a voltage across resistive load Rt. To steer current through resistive load Rt in the direction indicated by arrow A, input signal VIN2 goes high turning ON NMOS switches M12 and M13. When input signal VIN2 goes high, input signal VIN1 goes low to keep NMOS switches M11 and M14 OFF during the time NMOS switches M12 and M13 are ON. Conversely, to steer current through resistive load Rt in the direction indicated by arrow B, input signal VINI goes high and is applied to transistor switches M11 and M14 to make them conduct. Input signal VIN2 goes low to keep NMOS switches M12 and M13 OFF during this time. As a result, a full differential output voltage swing can be achieved.

Differential LVDS driver circuit 100 works well as long as the output voltage swing stays within the allowable common mode voltage range, usually a few volts. In general, LVDS driver circuit 100 can provide current to resistive load Rt only over some finite range of load voltage. The output voltage range over which the LVDS driver circuit 100 can function properly is known as its output compliance.

However, the problem often arises when multiple LVDS driver circuits 100 are connected to one bus, such as a backplane bus, that there become excessive currents through the LVDS driver circuit 100. The output high voltage VOH is the voltage at the output of either output transistors M11 or M13, and this output high voltage VOH of each LVDS driver circuit 100 depends on the current furnished to resistive load Rt. When each of the multiple LVDS driver circuits 100 tries to communicate over the bus at one time, the voltage differential produces a direct current through the LVDS driver circuits 100. This direct current travels onto the bus, which terminates at resistive load Rt. As a result, the output high voltage VOH increases until eventually each of the LVDS driver circuits 100 are pushed out of voltage output compliance, which practically stops the flow of current to resistive load Rt.

Typically, there is a specification limit for the voltage output compliance. For example, the output high voltage VOH of each driver should not exceed 2.4 volts. When the output high voltage VOH of each driver does exceed 2.4 volts, the excess current is provided on the backplane bus. As a result, the device can become self-destructive and has poor reliability.

Another drawback with the LVDS driver circuit 100 is an unbalanced output impedance. The DC constant current source I1 at the top of the LVDS driver circuit 100 has a high output impedance. In contrast, resistor R1, which typically is a small value resistor, at the bottom of the LVDS driver circuit 100 has a low impedance. This impedance mismatch causes rise and fall time mismatches for the LVDS driver circuit 100 which in turn causes power to be reflected on the bus creating undesirable noise, such as electromagnetic interference (EMI) on the common mode voltage.

A further drawback is the slow rise time which reduces the switching speed of the driver circuit 100. When either of the output transistors M11, M13 are switched ON, the drain current responds slowly because DC current source I1 has a high output impedance. Thus, for example, when transistor M13 is switched ON, there is a significant delay in the time it takes for the drain of transistor M13 to be pulled up by the current source I1 to voltage supply VDD. Such delay is a result of the high output impedance of DC current source I1.

Therefore, a need exists for a LVDS driver circuit that limits the output current, eliminates impedance mismatch and reduces rise time so as to be useful in high speed operations.

SUMMARY OF INVENTION

An LVDS driver circuit capable of limiting the output current, eliminating impedance mismatch and reducing rise time includes a constant direct current (DC) source, a current steering circuit comprising four voltage controlled switches, and a clamping circuit. The clamping circuit comprises a shunting transistor and a voltage follower.

The four switches are driven by two voltage signals which alternate between "high" (around 5 volts or voltage supply) and "low" (around −5 volts or ground) voltage levels. When the first voltage signal goes high, two of the four switches turn on to the direct current from the constant current source through a load resistor which pulls the voltage at the first output node low and the voltage at the second output node high. As a result, the output voltage is negative.

Conversely, when the other voltage signal is high the first two switches turn off and the other two switches turn on. Thus, the voltage at the first output node is pulled high and the voltage at the second output node is pulled low. As a result, the output voltage is positive. This is the high output voltage.

A control node couples to the voltage follower and the shunting circuit and between the current steering circuit and the constant current source. The voltage at the control node includes the high output voltage level of the output signal.

The voltage follower compares the voltage level at the control node with a reference signal value. Once the voltage level at the control node exceeds the reference signal value, the shunting circuit shunts the excess drive current from the constant DC current source in a direction away from the first and second output nodes. In this way, the excess drive current is prevented from reaching the first and second output nodes and the LVDS driver circuit is prevented from going out of compliance.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiments to represent the same or similar items.

DETAILED DESCRIPTION OF THE INVENTION

Figure 1:
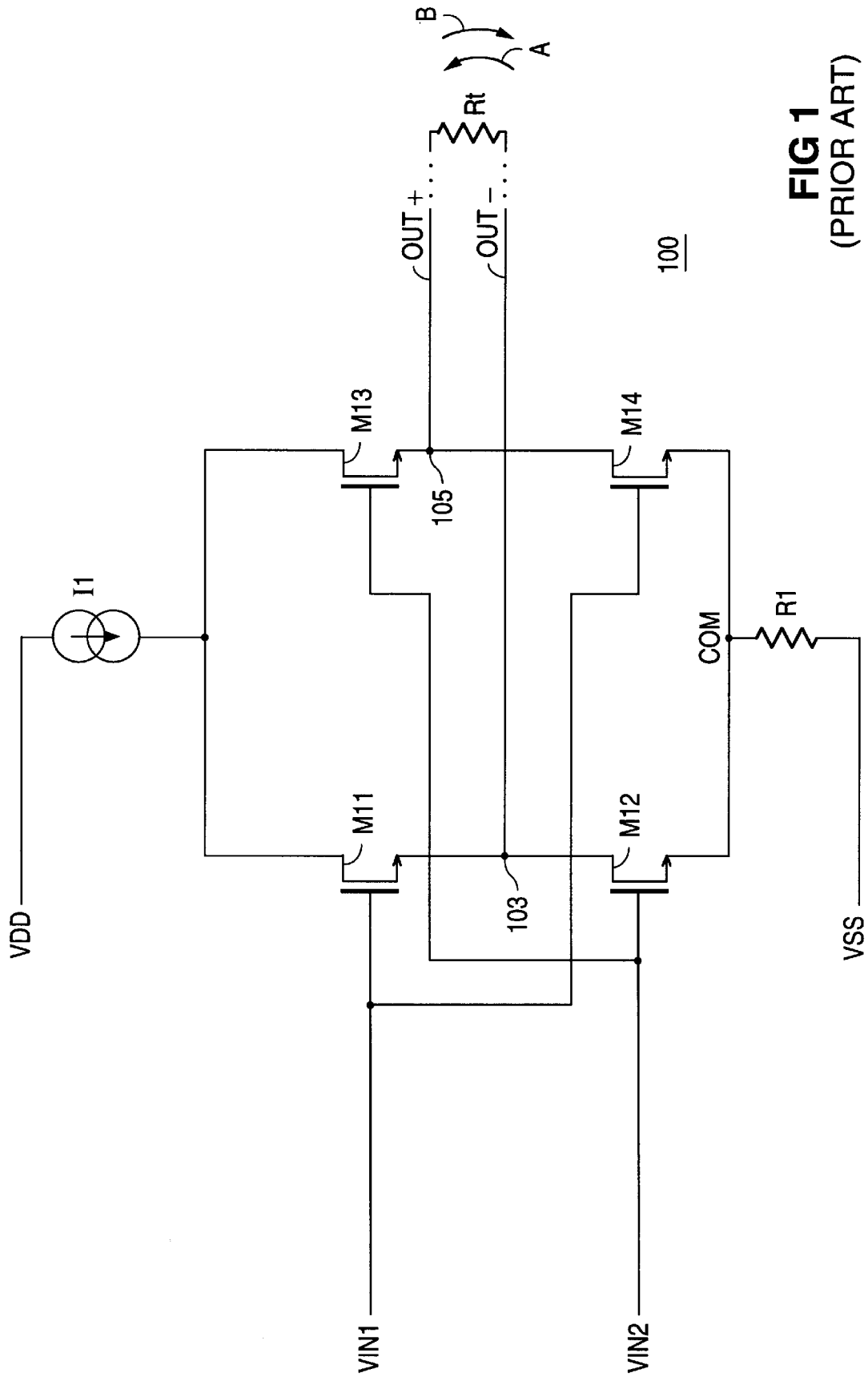
FIG. 1 illustrates a conventional low voltage differential swing circuit.
Figure 2:
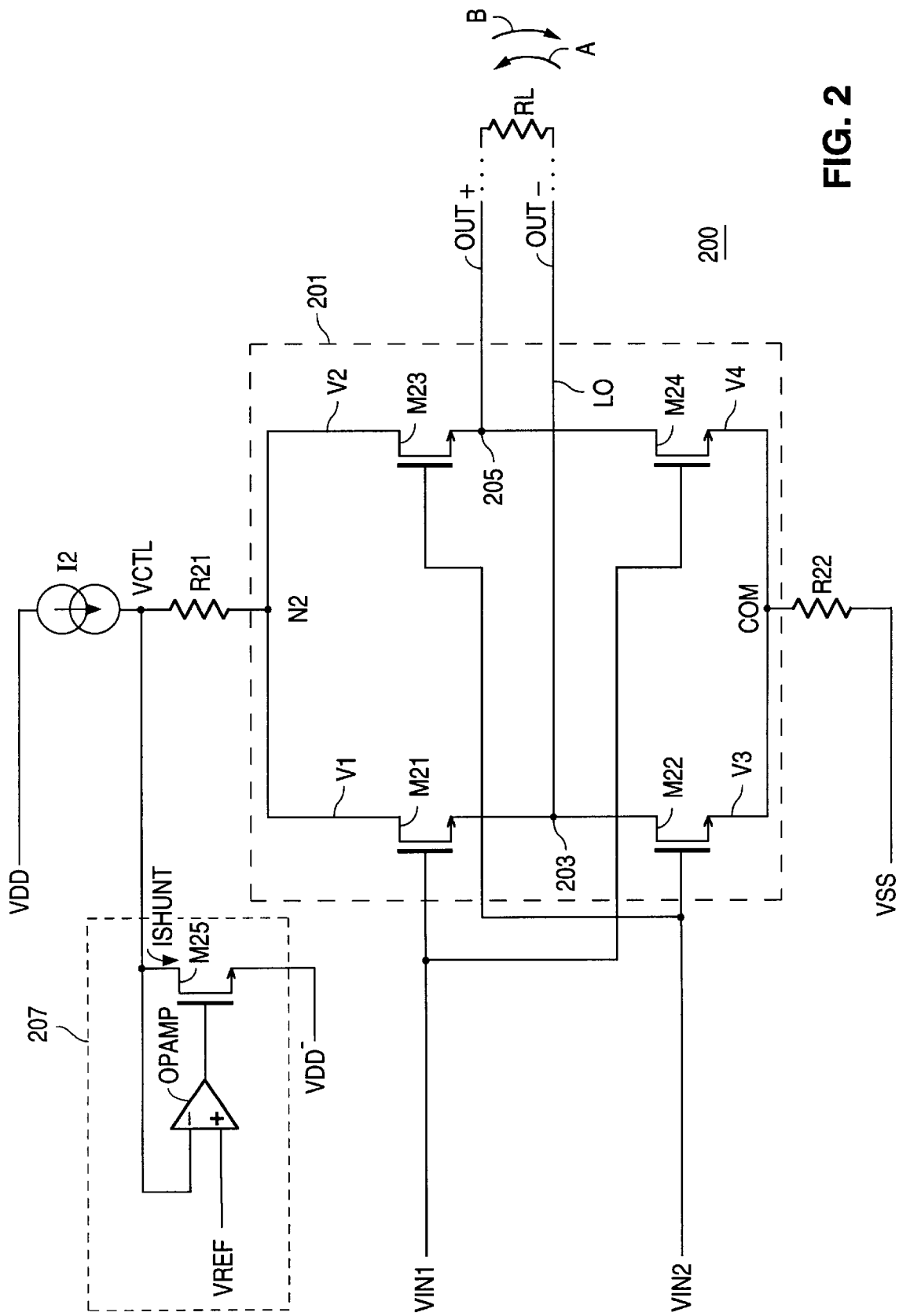
FIG. 2 illustrates a low voltage differential swing circuit in accordance the present invention.

In accordance with an illustrative embodiment of the invention, a high voltage clamped LVDS driver circuit 200 is shown in FIG. 2. The LVDS driver circuit 200 includes a direct current (DC) constant current source I2 coupled between voltage supply VDD and a voltage control node VCTL and a resistor R21 coupled between voltage control node VCTL and a node N2.

The LVDS driver circuit 200 also has a current steering circuit 201 having a modified typical H-bridge circuit configuration. A load segment LO extends horizontally and contains a resistive load RL. This load segment LO couples between end nodes 203, 205. Vertical segment V1 extends between left end node 203 and node N2. Vertical segment V2 extends between right end node 205 and node N2. Connected between left end node 203 and common node COM is vertical segment V3, while vertical segment V4 extends between right end node 205 and common node COM. Coupled between the common node COM and voltage supply VSS is a resistor R22. The reference to "vertical" and "horizontal" orientations of the segments of the modified H-bridge circuit 200 are, of course, merely for descriptive purposes and do not necessarily describe the actual layout of the circuit 200. Each of the vertical segments V1, V2, V3, V4 contains a respective NMOS switch M21, M22, M23, M24.

The switches M21–M24 are controlled by voltage input signals VIN1, VIN2. These voltage input signals VIN1, VIN2 are rail to rail voltage levels so the signal is either "high" or "low." In operation, these voltage signals VIN1, VIN2 are applied to the gates of transistors M21–M24, to direct current from current source I2 through the load resistor RL as indicated by arrows A and B. As used herein, the term "gate" broadly encompasses any form of control lead for changing the switching state of a device. As such, the term "gate" is intended to be synonymous with the "base" of a bipolar transistor, for example.

To steer the current from current source I2 through the load resistor RL in the direction indicated by arrow A, a high voltage level from voltage signal VIN1 is applied to MOS switches M21 and M24 to turn these switches on, while a low voltage level from voltage signal VIN2 is applied to MOS switches M22 and M23 to keep these switches off during this time. When the current steering circuit 201 steers the current in this direction, the voltage at output node 205 is pulled low and the voltage at the output node 203 is pulled high. Thus, since output transistor M21 is ON, the output high voltage VOH is the voltage at output node 203 and the output low voltage VOL is the voltage at output node 205.

Conversely, to direct current through resistive load RL in the direction indicated by arrow B, a high voltage level from voltage signal VIN2 is applied to MOS switches M22 and M23 to make them conduct, while the other switches M21 and M24 are kept off during this time. When current steering circuit 201 steers the current in this direction, the voltage at output node 205 is pulled high and the voltage at the output node 203 is pulled low. Thus, since output transistor M23 is ON, the output high voltage VOH is the voltage at output node 205 and the voltage low voltage VOL is the voltage at output node 203.

The LVDS driver circuit 200 also includes a clamping circuit 207 which comprises a shunting transistor circuit M25 coupled between voltage control node VCTL and voltage supply VSS and an operational amplifier OPAMP coupled to shunting transistor M25. The operational amplifier OPAMP operates as a voltage follower circuit, following current source I2 to allow the output from current source I2 to be controlled by a reference voltage VREF, where reference voltage VREF is an internally generated voltage.

Reference voltage VREF is input into the noninverting input terminal of operational amplifier OPAMP and the voltage at voltage control node VCTL is input into the inverting input terminal of operational amplifier OPAMP. Operational amplifier OPAMP senses the difference between reference voltage VREF and voltage at control node VCTL, applied at its two input terminals. In this exemplary embodiment, the voltage at the control node VCTL equals the output high voltage VOH plus the voltage across resistor R21, with respect to voltage supply VSS, plus the voltage drain-to-source voltage (vDS) of output transistor M21 or M22, whichever output transistor M21, M22 is active.

Shunt transistor M25 is coupled to the output of the operational amplifier OPAMP, such that together they provide the feedback mechanism that allows shunt transistor M25 to absorb extra currents from current source I2, as ISHUNT, when overload occurs. In this way, when the operational amplifier OPAMP determines that the voltage at the voltage control node VCTL reaches the reference voltage VREF level, the shunt transistor M25 consumes the excess current from current source I2 to prevent it from reaching the output load RL. Thus, the output high voltage VOH of the driver circuit 200 does not exceed the reference voltage VREF. By clamping the output high voltage VOH by the reference voltage VREF, the LVDS driver circuit 200 is prevented from going out of output compliance.

In operation, multiple LVDS driver circuits 200 may supply current to the resistive load RL. As more current is supplied to the resistive load RL, the output high voltage VOH increases which in turn causes the voltage at the voltage control node VCTL to increase. Once the operational amplifier OPAMP determines that the voltage at the voltage node VCTL reaches the reference voltage VREF, the excess current supplied by current source I2 intended for resistive load RL is conducted by the shunting transistor M25 instead. Thus, as the voltage at the voltage control node VCTL increases, the shunting transistor M25 conducts more current. By providing the shunting path, transistor M25 conducts the excess current rather than allowing the excess current to be conducted by transistors M21, M23. In this way, compliance of the output high voltage VOH is maintained.

Consider the following example where the voltage compliance specification requires an output high voltage VOH of 2.4 Volts, the voltage supply VDD is 3.3 Volts, and the DC constant current source provides 10 mA. Resistors R21 and R22 in this example are approximately 100 ohms. In this example, the reference potential for the voltages is voltage supply VSS, such as circuit ground. When only one driver circuit is supplying 10 mA of current to a 27 ohm resistive load RL the output high voltage VOH is 270 mV. Since this is well below the voltage compliance requirement of 2.4 volts, there is no problem. However, when there are twenty different driver circuits, all trying to drive the same bus, each of which is supplying 10 mA of current to the 27 ohm resistive load RL, problems may arise in conventional circuits, such as LVDS driver circuit 100. Since 20 driver circuits multiplied by 10 mA from each current source, multiplied by 27 ohms of load resistance equals 5.4 Volts, such voltage is actually larger than the voltage supply VDD. Such a very large output high voltage VOH may damage the LVDS driver circuit 100.

In contrast, such a problem is avoided if the 20 driver circuits have the configuration of LVDS driver circuit 200. In this case, the reference voltage VREF is set to 2.4 Volts. In operation, as the multiple driver circuits 200 supply current to the resistive load RL the output high voltage VOH increases. However, once the voltage at the voltage control node VCTL transcends the 2.4 reference voltage, the current from current source I2 intended for resistive load RL is conducted by shunting transistor M25. Because of the current overload protection provided by shunting transistor M25, the output high voltage VOH does not exceed the 2.4 reference voltage VREF and therefore, the LVDS driver circuits 200 do not go out of compliance.

The LVDS driver circuit 200 also solves the impedance mismatch problem encountered by the conventional LVDS driver circuit 100 by providing a balanced output impedance. When looking at the top of the LVDS driver circuit 200, although current source I2 has a high output impedance, operational amplifier OPAMP has a low output impedance since it functioning as a voltage source. Since reference voltage VREF is input into the noninverting input terminal of operational amplifier OPAMP and the voltage at voltage control node VCTL is input into the inverting input terminal of operational amplifier OPAMP, the output voltage at voltage control node VCTL follows the input reference voltage VREF. As a result, the reference voltage VREF value input to operational amplifier OPAMP will be seen at voltage control node VCTL. In this way, operational amplifier OPAMP functions as a voltage source, and voltage sources typically have low output impedances.

When looking at the bottom of the LVDS driver circuit 200, resistor R22 has a low impedance. Therefore, when looking at the output impedance of LVDS driver circuit 200, the output impedances of the voltage follower OPAMP, shunt transistor M25 and resistor R21, substantially match that of resistor R22.

Since the LVDS driver circuit 200 has a more balanced output impedance, the rise and fall times of LVDS driver circuit 200 are more closely matched and the common mode voltage VCM remains substantially flat when the switching transistors M21–M24 perform the switching transition.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a current driving circuit for providing a differential signal to an external circuit, the current driver circuit comprising:

a current source configured to generate a first drive current;

first and second output nodes configured to couple to an external circuit and convey second and third drive currents;

a current steering circuit coupled between the current source and the first and second output nodes and configured to receive first and second input signals and in accordance therewith direct the first drive current in first and second directions to provide the second and third drive currents, wherein the second and third drive currents together form at the first and second output nodes a differential output signal;

a control node coupled between the current source and the current steering circuit and configured to receive a control signal having a value which varies in relation to an output high voltage signal of the current driving circuit; and a clamping circuit coupled to the control node and configured to compare the value of the control signal with a reference signal value, and in accordance therewith shunt a portion of the first drive current away from the first and second output nodes when the value of the control signal transcends the reference signal value.

2. The apparatus of claim 1, wherein the portion of the first drive current is proportional to a difference between the value of the control signal and the reference signal value.

3. The apparatus of claim 1, wherein the clamping circuit comprises a shunting circuit and an operational amplifier.

4. The apparatus of claim 3, wherein the operational amplifier couples to the control node and is configured to compare the value of the control signal with the reference signal value, and wherein the shunting circuit couples between the operational amplifier and the control node and is configured to shunt the portion of the first drive current away from the first and second output nodes when the value of the control signal transcends the reference signal value.

5. The apparatus of claim 4, wherein the shunting circuit comprises an n-channel metal oxide semiconductor (MOS) transistor, having a drain, a gate and a source.

6. The apparatus of claim 3, wherein the operational amplifier comprises a first input, a second input and an output, wherein the first input is configured to receive the reference signal value, the second input couples to the control node and the drain of the MOS transistor, and the output couples to the gate of the MOS transistor.

7. The apparatus of claim 1, wherein the external circuit comprises a resistive circuit, the resistive circuit coupled between the first and second output nodes and configured to receive the second and third drive currents and in accordance therewith generate the differential output signal.

8. An apparatus including a current driving circuit for providing a differential signal to a load, the current driver circuit comprising:

a current source configured to generate a first drive current;

first and second output nodes configured to couple to an external circuit and convey second and third drive currents;

a first current sourcing circuit, coupled between the current source and the first output node, configured to receive a first input signal and in accordance therewith source the first drive current to generate the second drive current, a second current sourcing circuit, coupled between the current source and the second output node, configured to receive a second input signal and in accordance therewith source the first drive current to generate the third drive current, wherein the second and third drive currents together form at the first and second output nodes a differential output signal;

a control node coupled between the current source and the current sourcing circuits and configured to receive a control signal with a value which varies in relation to an output high voltage signal of the current driving circuit;

an operational amplifier coupled to the control node and configured to compare the value of the control signal with a reference signal value, wherein when the value of the control signal transcends the reference signal value, an excess signal is provided; and a shunting circuit coupled between the operational amplifier and the control node and configured to shunt the excess signal in a direction away from the first and second output nodes, such that the signal level of the differential output signal does not transcend the reference signal value.

9. The apparatus of claim 8, wherein the shunting circuit comprises an n-channel metal oxide semiconductor (MOS) transistor, having a drain, a gate and a source.

10. The apparatus of claim 9, wherein the operational amplifier, the operational amplifier comprises a first input, a second input and an output, wherein the first input comprises the reference signal value, the second input couples to the control node and the drain of the MOS transistor, and the output couples to the gate of the MOS transistor.

11. The apparatus of claim 8, wherein the external circuit comprises a resistive circuit, the resistive circuit coupled between the first and second output nodes and configured to receive the first and second drive currents and in accordance therewith generate the differential output signal.

12. A method for clamping a low voltage differential swing output, the method comprising the steps of:

receiving a control signal by a control node and in accordance therewith conveying a first drive current via the control node;

conveying second and third drive currents via first and second output nodes which are coupled to an external circuit, wherein the second and third drive currents together form at the first and second output nodes a differential output signal, and wherein a value of the control signal varies in relation to an output high voltage signal of the current driving circuit;

comparing the value of the control signal with a reference signal value; and shunting a portion of the first drive current in a direction away from the first and second output nodes when the value of the control signal transcends the reference signal value, wherein the portion of the first drive portion is prevented from reaching the first and second output nodes.

* * * * *